United States Patent
Hwang

(10) Patent No.: US 9,910,121 B2
(45) Date of Patent: Mar. 6, 2018

(54) APPARATUS AND METHOD FOR DIAGNOSING FAILURE OF CURRENT SENSOR OF BATTERY SYSTEM FOR ECO-FRIENDLY VEHICLE

(71) Applicants: Hyundai Motor Company, Seoul (KR); Kia Motors Corporation, Seoul (KR)

(72) Inventor: Do Sung Hwang, Gunpo-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 205 days.

(21) Appl. No.: 14/931,442

(22) Filed: Nov. 3, 2015

(65) Prior Publication Data

US 2016/0313403 A1    Oct. 27, 2016

(30) Foreign Application Priority Data

Apr. 23, 2015    (KR) .......................... 10-2015-0056915

(51) Int. Cl.
```
G01R 35/00      (2006.01)
G01R 15/20      (2006.01)
G01R 31/00      (2006.01)
G01R 31/36      (2006.01)
```

(52) U.S. Cl.
CPC .............. *G01R 35/00* (2013.01); *G01R 15/20* (2013.01); *G01R 31/007* (2013.01); *G01R 31/3627* (2013.01)

(58) Field of Classification Search
CPC .... G01R 35/00; G01R 31/3627; G01R 15/20; G01R 31/007
USPC .......................................................... 324/426
See application file for complete search history.

(56) References Cited

U.S. PATENT DOCUMENTS

| | | | | |
|---|---|---|---|---|
| 7,284,365 | B2* | 10/2007 | Abe | F01N 3/2013 60/277 |
| 8,924,059 | B2* | 12/2014 | Yoshikawa | G05B 19/02 701/22 |
| 9,132,733 | B2* | 9/2015 | Tago | B60L 3/0069 |
| 9,465,084 | B2* | 10/2016 | Park | G01R 31/3658 |
| 2014/0147713 | A1* | 5/2014 | Mizobe | G01R 31/362 429/90 |
| 2014/0159756 | A1* | 6/2014 | Ueno | G01R 15/202 324/750.01 |

FOREIGN PATENT DOCUMENTS

| | | |
|---|---|---|
| JP | 2002151165 | 5/2002 |
| JP | 2002277520 | 9/2002 |
| JP | 2003312492 | 11/2003 |

(Continued)

*Primary Examiner* — M'Baye Diao
(74) *Attorney, Agent, or Firm* — Brinks Gilson & Lione

(57) ABSTRACT

Provided are apparatuses and methods for diagnosing failure of a current sensor of a battery system for an eco-friendly vehicle. One apparatus for diagnosing failure of a current sensor of a battery system for an eco-friendly vehicle includes a high voltage battery, a current sensor configured to measure a current output from the high voltage battery, and a controller configured to measure an offset current through the current sensor when an ignition key is turned off or turned on, and diagnose failure of the current sensor on the basis of the measured offset current.

13 Claims, 3 Drawing Sheets

(56) References Cited

FOREIGN PATENT DOCUMENTS

| | | |
|---|---|---|
| JP | 2005037286 | 2/2005 |
| JP | 2006246564 | 9/2006 |
| JP | 2007-078377 | 3/2007 |
| JP | 2008072875 | 3/2008 |
| KR | 10-2010-0113247 | 10/2010 |
| KR | 10-2011-0085713 | 7/2011 |

\* cited by examiner

APPARATUS AND METHOD FOR DIAGNOSING FAILURE OF CURRENT SENSOR OF BATTERY SYSTEM FOR ECO-FRIENDLY VEHICLE

CROSS-REFERENCE TO RELATED APPLICATION

This application claims the benefit of priority to Korean Patent Application No. 10-2015-0056915, filed on Apr. 23, 2015, the disclosure of which is hereby incorporated by reference.

FIELD

The present disclosure relates to apparatuses and methods for diagnosing failure of a current sensor of a battery system for an eco-friendly vehicle, capable of measuring an offset current when the ignition is turned off and when the ignition is turned on next time, and determining whether a current sensor has a fault (i.e., failure or an error) on the basis of the measured offset current.

BACKGROUND

The statements in this section merely provide background information related to the present disclosure and may not constitute prior art.

In general, a high voltage battery and an inverter are applied to eco-friendly vehicles such as hybrid vehicles and electric vehicles, and a current sensor is used in an electric power system such as an inverter.

A controller of an eco-friendly vehicle constantly measures a current of a battery while driving and charging to control electric power and monitor states of the vehicle and various components.

A large current, as a direct current (DC) of up to 200 to 400 amperes (A), flows in an eco-friendly vehicle, and in order to measure the large current, a Hall effect current sensor is commonly used. A Hall effect sensor or a Hall sensor, which measures a magnetic field induced by a current to measure the current, is advantageously used as a non-contact type sensor, but has shortcomings in that a current value thereof under a condition of 0A used as a reference drifts.

Under the condition of 0A, a current of the current sensor drifts up to 3A according to changes in an ambient temperature, and in addition, there are variations in sensors. Thus, the controller should determine a current value (offset) corresponding to the condition of 0A before the current sensor is used.

In the related art, when a predetermined period of time has lapsed since the ignition was turned off, an offset current is measured under the condition of 0A. Here, offset currents are measured for a predetermined period of time tens to hundreds of times, and the measured offset currents are averaged.

The condition of 0A after the ignition is turned off is secured by turning off a battery or a main switch (relay) of a power source. That is, after the switch is turned off, 0A is checked and an offset current is subsequently measured. Thereafter, when the ignition is turned on, a current is calculated on the basis of the measured offset current.

In a case in which the offset current measured for a predetermined period of time is abnormal, the controller diagnoses failure, and when the ignition turned on next time, the controller continuously uses an immediately previous normal offset current.

However, in the related art, in a case in which an error occurs after the ignition is turned off or in a case in which the current sensor itself or power of the current sensor is abnormal when the ignition is turned on next time, an erroneous current value may be calculated and used.

SUMMARY

The present disclosure has been made to address the above-mentioned problems occurring in the prior art while advantages achieved by the prior art are maintained intact.

An aspect of the present disclosure provides an apparatus and method for diagnosing failure of a current sensor of a battery system for an eco-friendly vehicle, capable of measuring an offset current when the ignition is turned off and when the ignition is turned on next time and determining whether a current sensor has a fault on the basis of the measured offset current.

Technical subjects of the present disclosure are not limited to the foregoing technical subjects and any other technical subjects not mentioned will be clearly understood by a skilled person in the art from the following description.

According to an exemplary embodiment of the present disclosure, an apparatus for diagnosing failure of a current sensor of a battery system for an eco-friendly vehicle includes: a high voltage battery; a current sensor configured to measure a current output from the high voltage battery; and a controller configured to measure an offset current through the current sensor when an ignition key is turned off or turned on, and diagnose failure of the current sensor on the basis of the measured offset current.

The current sensor may be configured as a Hall effect current meter, a Hall sensor, or a magnetic sensor.

When the ignition key is turned off, the controller may measure a first offset current for a first preset period of time, and thereafter, when the ignition key is turned on, the controller may measure a second offset current for a second preset period of time and determine whether the first offset current and the second offset current are equal to or greater than a reference value.

When the first offset current and the second offset current are less than the reference value, the controller may determine that the current sensor is normal, and set the first offset current as an offset current of the current sensor.

When any one of the first offset current and the second offset current is equal to or greater than the reference value, the controller may measure a third offset current through the current sensor for a third preset period of time, and determine whether the third offset current is equal to or greater than the reference value.

When the third offset current is less than the reference value, the controller may determine that the current sensor is normal, and set the third offset current as an offset current of the current sensor.

When the third offset current is equal to or greater than the reference value, the controller may determine that the current sensor has a fault, and set an immediately previous offset current as an offset current of the current sensor.

When the first offset current and the second offset current are equal to or greater than the reference value, the controller may determine that the current sensor has a fault, and set an immediately previous offset current as an offset current of the current sensor.

According to another exemplary embodiment of the present disclosure, a method for diagnosing failure of a current sensor of a battery system for an eco-friendly vehicle includes: when OFF of an ignition key is sensed, measuring a first offset current through the current sensor; when ON of the ignition key is sensed after the measurement of the first offset current, measuring a second offset current through the current sensor; determining whether each of the first offset current and the second offset current is equal to or greater than a reference value; and diagnosing failure of the current sensor according to whether the first offset current and the second offset current are equal to or greater than the reference value.

In the diagnosing of failure, when the first offset current and the second offset current are less than the reference value, the current sensor may be determined to be normal and the first offset current may be set as an offset current of the current sensor.

The diagnosing of failure may include: when any one of the first offset current and the second offset current is equal to or greater than the reference value, measuring a third offset current through the current sensor; and determining whether the third offset current is equal to or greater than the reference value.

The diagnosing of failure may further include: when the third offset current is less than the reference value, determining the current sensor as being normal and setting the third offset current as an offset current of the current sensor.

The diagnosing of failure may further include: when the third offset current is equal to or greater than the reference value, determining the current sensor as having a fault, and setting an immediately previous offset current as an offset current of the current sensor.

In the diagnosing of failure, when the first offset current and the second offset current are equal to or greater than the reference value, the current sensor may be determined as having a fault and an immediately previous offset current may be set as an offset current of the current sensor.

Specific matters of other exemplary embodiments are included in the detailed description and drawings.

Further areas of applicability will become apparent from the description provided herein. It should be understood that the description and specific examples are intended for purposes of illustration only and are not intended to limit the scope of the present disclosure

DRAWINGS

The above and other objects, features and advantages of the present disclosure will be more apparent from the following detailed description taken in conjunction with the accompanying drawings.

DETAILED DESCRIPTION

Terms of "comprise" and variations such as "includes", "comprises" or "has" described in this disclosure will be understood to imply the inclusion of stated elements but not the exclusion of any other elements, unless explicitly described to the contrary.

In addition, the terms "-er", "-or" and "module" described in the specification mean units for processing at least one function and operation and can be implemented by hardware components or software components and combinations thereof. Articles such as "a" or "the" may include plural forms unless referred to the contrary in context describing the present disclosure.

Hereinafter, exemplary embodiment of the present disclosure will be described in detail with reference to the accompanying drawings.

In an exemplary embodiment of the present disclosure, a scheme of performing measurement twice is used in consideration of a case in which an offset current of a current sensor measured when an ignition of a vehicle is turned off is normal, the current sensor has a fault or has a significant error when the ignition turned on next time. Also, in an exemplary embodiment of the present disclosure, even though the current sensor has a fault when the ignition is turned off, if the current sensor is recovered to be normal, the current sensor may not be diagnosed as having a fault but may be normally used.

Figure 1:
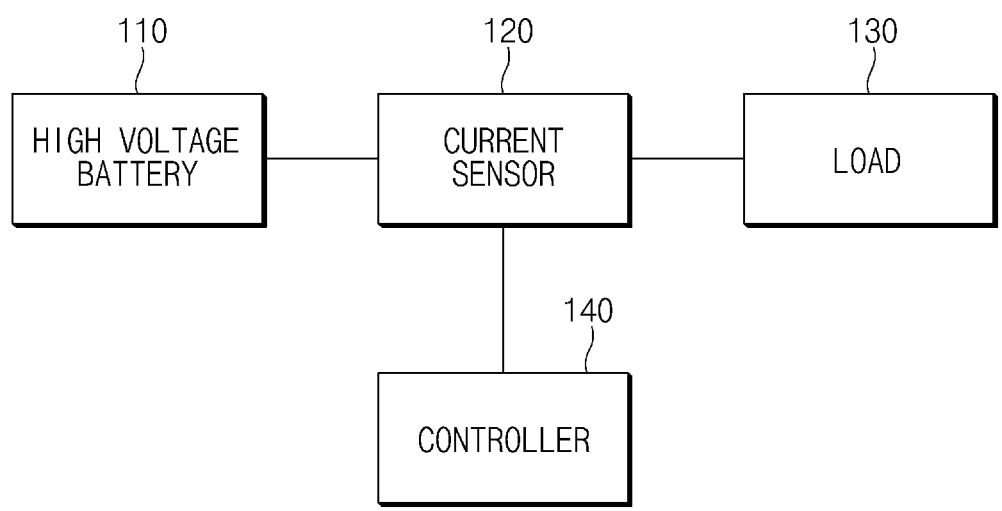
FIG. 1 is a block diagram illustrating an apparatus for diagnosing failure of a current sensor of a battery system for an eco-friendly vehicle.
Figure 2:
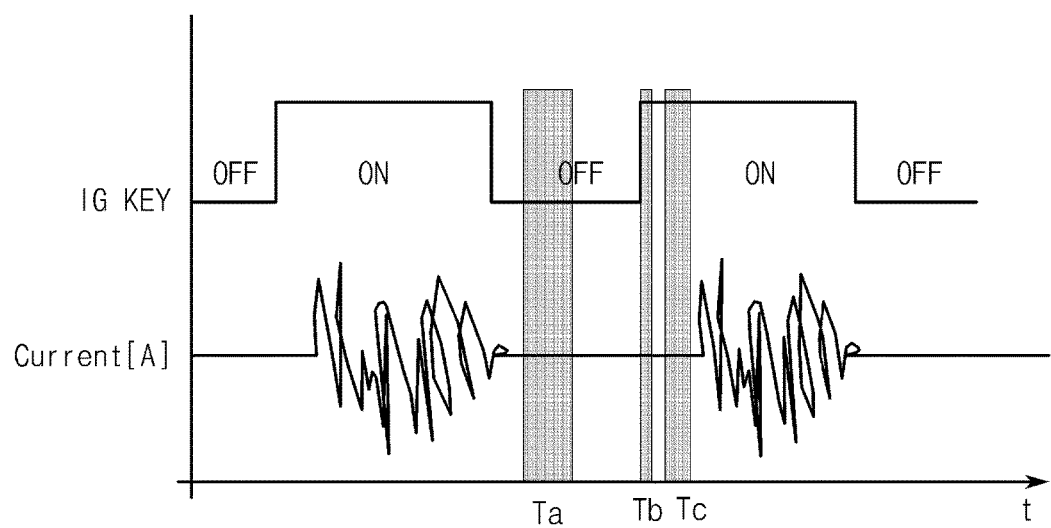
FIG. 2 is a graph illustrating an offset measurement section.

FIG. 1 is a block diagram illustrating an apparatus for diagnosing failure of a current sensor of a battery system for an eco-friendly vehicle, and FIG. 2 is a graph illustrating an offset measurement section.

Referring to FIG. 1, the apparatus for diagnosing failure of a current sensor of a battery system for an eco-friendly vehicle includes a high voltage battery 110, a current sensor 120, a load 130, and a controller 140.

The high voltage battery 110 provides electric power required for driving a motor of a vehicle. The high voltage battery 110 includes a plurality of battery modules and a relay for blocking (relay is opened) a path for supplying power to the load 130 or releasing the blocked path (relay is closed).

The current sensor 120 measures current output (or discharged) from the high voltage battery 110. The current sensor 120 may be implemented as a Hall effect current meter, a Hall sensor, or a magnetic sensor.

The load 130 is driven upon receiving power provided from the high voltage battery 110. In the present exemplary embodiment, a case in which the high voltage battery 110 directly supplies power to the load 130 is described as an example, but a converter and/or an inverter may be installed between the high voltage battery 110 and the load 130. Here, the converter and the inverter serve to convert electric power output from the high voltage battery 110 in order to provide electric power required for driving the load 130.

When the ignition is turned off, the controller 140 measures a current value (offset) through the current sensor 120. After an ignition key is turned off, the controller 140 measures a first offset current (offset) through the current sensor 120 for a first preset period of time Ta from a point in time at which a predetermined period of time has lapsed (which starts from a point in time at which a main relay of the high voltage battery 110 is turned off).

After the first offset is measured, when the ignition key is turned on, the controller 140 immediately measures a second offset current through the current sensor 120 for a second preset period of time Tb. Here, measurement of the offset current after the ignition key is turned on is directly related to starting performance of the vehicle, and thus, the measurement of the offset current should be performed within a short time. Thus, the second preset period of time Tb is set to be less than 100 milliseconds (ms) in consideration of a time required for starting the vehicle after the ignition key is turned on.

The controller 140 determines whether the offset currents measured for the first preset period of time Ta and the second preset period of time Tb are equal to or greater than a reference value. The controller 140 may further perform offset current measurement one more time according to the determination result. When the measured offset currents are equal to or greater than the reference value, the controller 140 determines that the measured offset currents are abnormal, and when the measured offset currents are less than the reference value, the controller 140 determines that the measured offset currents are normal.

As illustrated in Table 1, the controller 140 diagnoses failure according to the first offset current and the second offset current, and sets offset currents.

TABLE 1

| First offset (Ta) | Second offset (Tb) | Third offset (Tc) | Determination |
|---|---|---|---|
| Normal | Normal | — | Normal, first offset is used |
| Normal | Abnormal | Normal | Normal, third offset is used |
| Normal | Abnormal | Abnormal | Failure, immediately previous (final) normal offset is used |
| Abnormal | Normal | Normal | Normal, third offset is used |
| Abnormal | Normal | Abnormal | Failure, immediately previous (final) normal offset is used |
| Abnormal | Abnormal | — | Failure, immediately previous (final) normal offset is used |

The controller 140 measures offset currents two or more times for each of the preset periods of time Ta, Tb, and Tc, and averages the measured offset currents to use the same. In other words, the first offset, the second offset, and the third offset are average values of the measured values.

Figure 3:
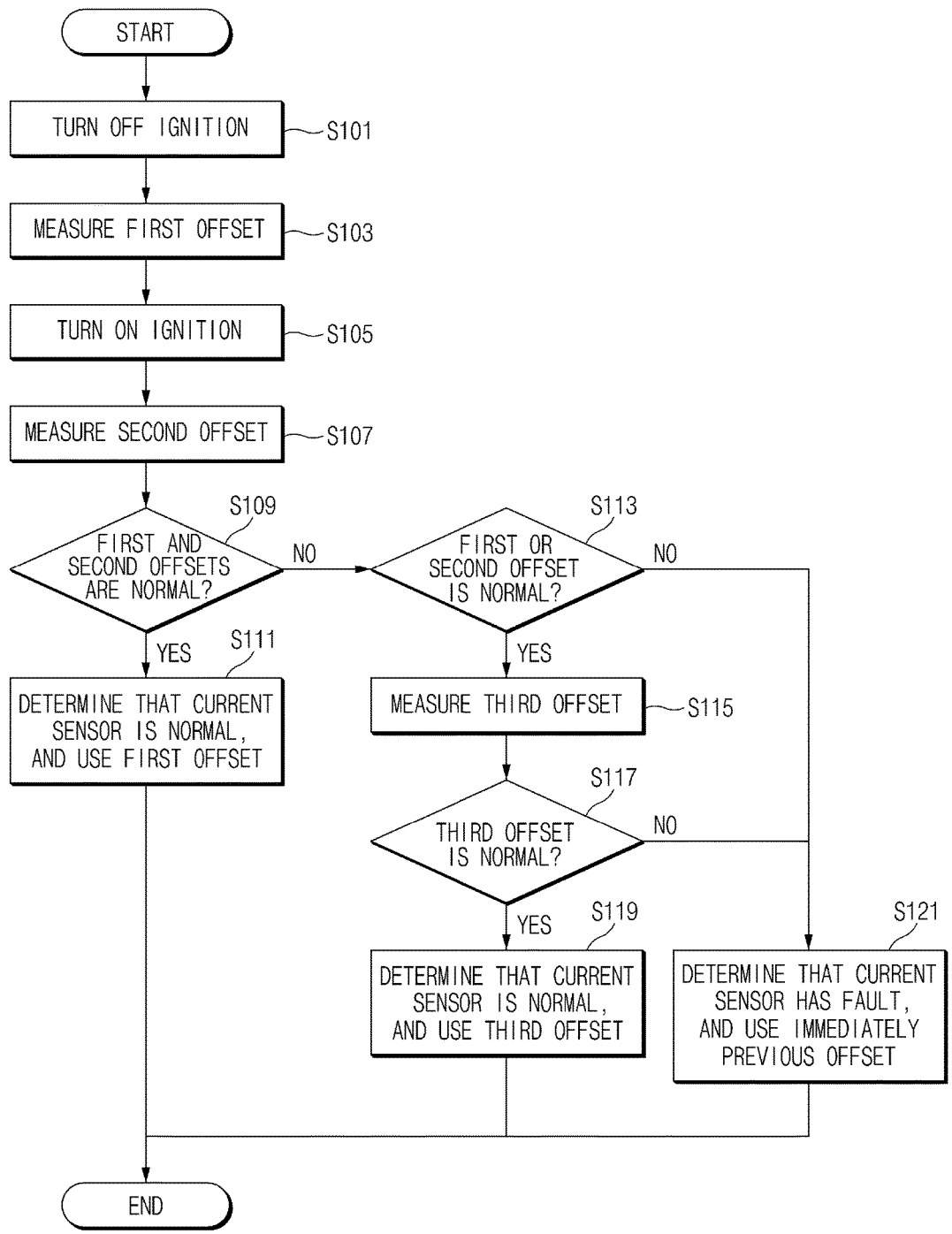
FIG. 3 is a flow chart illustrating a method for diagnosing failure of a current sensor of a battery system for an eco-friendly vehicle.

FIG. 3 is a flow chart illustrating a method for diagnosing failure of a current sensor of a battery system for an eco-friendly vehicle.

When the ignition key is sensed to be off, the controller 140 turns off the main relay of the high voltage battery 110 and measures a first offset current (first offset) through the current sensor 120 in operations S101 and S103. After the ignition key was turned off, when a predetermined period of time (a period of time required for turning off the main relay) has lapsed, the controller 140 measures first offsets for the first preset period of time Ta. Thereafter, the controller 140 averages the measured first offsets and stores the average value in a memory (not shown).

When the ignition key is sensed to be on, the controller 140 measures a second offset current (second offset) through the current sensor 120 in operations S105 and S107. The controller 140 starts to measure the second offset through the current sensor 120 immediately when ON of the ignition key is sensed. The controller 140 measures secondary offsets for a second preset period of time Tb, averages the measured second offsets, and stores the averaged second offset in a memory (not shown).

When the first offset and the second offset are normal, the controller 140 determines that the current sensor 120 are normal (normal state), and sets the first offset as an offset current (offset) of the current sensor 120 in operations S109 and S111.

Meanwhile, when the first offset and the second offset are abnormal in operation S109, the controller 140 determines whether any one of the first offset and the second offset is normal in operation S113.

When the first offset or the second offset is normal, the controller 140 measures a third offset through the current sensor 120 in operation S115. The controller 140 measures the third offsets for a third preset period of time Tc, averages the measured third offsets, and stores the average value in the memory (not shown).

The controller 140 determines whether the third offset is equal to or greater than a reference value in operation S117. That is, when the third offset is equal to or greater than the reference value, the controller 140 determines that the third offset is abnormal, and when the third offset is less than the reference values, the controller 140 determines that the third offset is normal.

When the third offset is normal, the controller 140 determines that the current sensor 120 is normal (normal state) and uses the third offset as an offset of the current sensor 120 in operation S119.

Meanwhile, when the first offset and the second offset are abnormal or the measured third offset is abnormal, the controller 140 determines that the current sensor 120 has a fault, and sets an immediately pervious offset as an offset of the current sensor 120 in operation S121.

As described above, according to exemplary embodiments of the present disclosure, an offset current is measured when an ignition is turned off, and an offset current is measured when the ignition is turned on next time, and thereafter, whether the current sensor has an error is determined on the basis of the measured offset currents. Thus, failure of the current sensor occurring after the ignition is turned off or after the ignition is turned on next time is sensed, and an accurate battery current may be measured by using an accurate offset current.

Also, according to exemplary embodiments of the present disclosure, since only when the current sensor has an error in actuality, failure of the current sensor is sensed, and thus, an erroneous sensing or non-sensing incidence may be improved.

Also, according to exemplary embodiments of the present disclosure, an additional offset measurement is performed only when failure of the current sensor is in doubt, and thus, a time actually required for starting a vehicle is not affected.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for diagnosing failure of a current sensor of a battery system for an eco-friendly vehicle, the apparatus comprising:
a high voltage battery;
a current sensor configured to measure a current output from the high voltage battery; and
a controller configured to measure an offset current through the current sensor when an ignition key is turned off or turned on, and to diagnose failure of the current sensor based on the measured offset current;
wherein when the ignition key is turned off, the controller is configured to measure a first offset current for a first preset period of time, and thereafter, when the ignition key is turned on, the controller is configured to measure a second offset current for a second preset period of time and determine whether the first offset current and the second offset current are equal to or greater than a reference value.

2. The apparatus according to claim 1, wherein the current sensor is configured as a Hall effect current meter, a Hall sensor, or a magnetic sensor.

3. The apparatus according to claim 1, wherein when the first offset current and the second offset current are less than the reference value, the controller is configured to determine that the current sensor is normal, and to set the first offset current as an offset current of the current sensor.

4. The apparatus according to claim 1, wherein when any one of the first offset current and the second offset current is equal to or greater than the reference value, the controller is configured to measure a third offset current through the current sensor for a third preset period of time, and to determine whether the third offset current is equal to or greater than the reference value.

5. The apparatus according to claim 4, wherein when the third offset current is less than the reference value, the controller is configured to determine that the current sensor is normal, and to set the third offset current as an offset current of the current sensor.

6. The apparatus according to claim 4, wherein when the third offset current is equal to or greater than the reference value, the controller is configured to determine that the current sensor has a fault, and to set an immediately previous offset current as an offset current of the current sensor.

7. The apparatus according to claim 1, wherein when the first offset current and the second offset current are equal to or greater than the reference value, the controller is configured to determine that the current sensor has a fault, and to set an immediately previous offset current as an offset current of the current sensor.

8. A method for diagnosing failure of a current sensor of a battery system for an eco-friendly vehicle, the method comprising:
  when an ignition key is sensed to be off, measuring, by a current sensor, a first offset current for a first preset period of time;
  when the ignition key is sensed to be on after the measurement of the first offset current, measuring, by the current sensor, a second offset current for a second preset period of time;
  determining, by a controller, whether each of the first offset current and the second offset current is equal to or greater than a reference value; and
  diagnosing, by the controller, failure of the current sensor based on whether the first offset current and the second offset current are equal to or greater than the reference value.

9. The method according to claim 8, wherein the diagnosing, by the controller, failure of the current sensor comprises:
  when the first offset current and the second offset current are less than the reference value, determining the current sensor to be normal and setting the first offset current as an offset current of the current sensor.

10. The method according to claim 8, wherein the diagnosing, by the controller, failure of the current sensor comprises:
  when any one of the first offset current and the second offset current is equal to or greater than the reference value, measuring a third offset current through the current sensor; and
  determining whether the third offset current is equal to or greater than the reference value.

11. The method according to claim 10, wherein the diagnosing, by the controller, failure of the current sensor further comprises:
  when the third offset current is less than the reference value, determining the current sensor as being normal and setting the third offset current as an offset current of the current sensor.

12. The method according to claim 10, wherein the diagnosing, by the controller, failure of the current sensor further comprises:
  when the third offset current is equal to or greater than the reference value, determining the current sensor as having a fault, and setting an immediately previous offset current as an offset current of the current sensor.

13. The method according to claim 8, wherein the diagnosing, by the controller, failure of the current sensor comprises: when the first offset current and the second offset current are equal to or greater than the reference value, determining the current sensor as having a fault and setting an immediately previous offset current as an offset current of the current sensor.

* * * * *